(12) United States Patent
Choudhury et al.

(10) Patent No.: US 8,493,120 B2
(45) Date of Patent: Jul. 23, 2013

(54) STORAGE CIRCUITRY AND METHOD WITH INCREASED RESILIENCE TO SINGLE EVENT UPSETS

(75) Inventors: Mihir Rajanikant Choudhury, San Jose, CA (US); Vikas Chandra, Fremont, CA (US)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 13/064,207

(22) Filed: Mar. 10, 2011

(65) Prior Publication Data

US 2012/0229187 A1    Sep. 13, 2012

(51) Int. Cl.
*H03K 3/00*    (2006.01)

(52) U.S. Cl.
USPC ........................................................ 327/203

(58) Field of Classification Search
USPC .................. 327/199–203, 208, 210–215, 218
See application file for complete search history.

(56) References Cited

U.S. PATENT DOCUMENTS

| | | | |
|---|---|---|---|
| 3,893,070 A | 7/1975 | Bossen et al. | |
| 3,905,023 A | 9/1975 | Perpiglia | |
| 4,227,175 A | 10/1980 | Newman | |
| 4,339,657 A | 7/1982 | Larson et al. | |
| 4,558,379 A | 12/1985 | Hutter et al. | |
| 4,633,465 A | 12/1986 | Fitch et al. | |
| 4,635,223 A | 1/1987 | Boone et al. | |
| 4,669,092 A | 5/1987 | Sari et al. | |
| 4,756,005 A | 7/1988 | Shedd | |
| 4,833,635 A | 5/1989 | McCanny et al. | |
| 4,885,715 A | 12/1989 | McCanny et al. | |
| 4,918,709 A | 4/1990 | Fitch | |
| 4,975,930 A | 12/1990 | Shaw | |
| 5,043,990 A | 8/1991 | Doi et al. | |

(Continued)

FOREIGN PATENT DOCUMENTS

| | | |
|---|---|---|
| EP | 0 366 331 | 5/1990 |
| EP | 0 374 420 | 6/1990 |

(Continued)

OTHER PUBLICATIONS

Notice of Allowance mailed Dec. 16, 2011 in co-pending U.S. Appl. No. 12/285,517.

(Continued)

*Primary Examiner* — Lincoln Donovan
*Assistant Examiner* — Sibin Chen
(74) *Attorney, Agent, or Firm* — Nixon & Vanderhye P.C.

(57) ABSTRACT

Storage circuitry is provided with increased resilience to single event upsets, along with a method of operation of such circuitry. The storage circuitry has a first storage block configured in at least one mode of operation to perform a first storage function, and a second storage block configured in at least one mode of operation to perform a second storage function distinct from said first storage function. Configuration circuitry is responsive to a predetermined mode of operation where the second storage function is unused, to configure the second storage block to operate in parallel with the first storage block. By arranging the two storage blocks in parallel when one of the storage blocks is otherwise performing no useful function, this in effect increases the size of the storage block that is still performing the useful storage function, and as a result increases its resilience to single event upsets. Such an approach has minimal area and power consumption overhead, and provides a small storage circuit that can be readily used in a wide variety of sequential cell designs.

12 Claims, 6 Drawing Sheets

U.S. PATENT DOCUMENTS

| | | | |
|---|---|---|---|
| 5,203,003 A | 4/1993 | Donner | |
| 5,276,690 A | 1/1994 | Lee et al. | |
| 5,291,496 A | 3/1994 | Andaleon et al. | |
| 5,311,070 A | 5/1994 | Dooley | |
| 5,313,625 A | 5/1994 | Hess et al. | |
| 5,321,705 A | 6/1994 | Gould et al. | |
| 5,400,370 A | 3/1995 | Guo | |
| 5,402,273 A | 3/1995 | Tucker | |
| 5,408,200 A | 4/1995 | Buhler | |
| 5,414,722 A | 5/1995 | Tollum | |
| 5,426,746 A | 6/1995 | Sekiguchi | |
| 5,455,536 A | 10/1995 | Kono et al. | |
| 5,463,351 A | 10/1995 | Marko et al. | |
| 5,504,703 A | 4/1996 | Bansal | |
| 5,504,859 A | 4/1996 | Gustafson et al. | |
| 5,509,076 A | 4/1996 | Sprunk | |
| 5,528,637 A | 6/1996 | Sevenhans et al. | |
| 5,553,232 A | 9/1996 | Wilhite et al. | |
| 5,572,662 A | 11/1996 | Ohta et al. | |
| 5,615,263 A | 3/1997 | Takahashi | |
| 5,625,652 A | 4/1997 | Petranovich | |
| 5,627,412 A | 5/1997 | Beard | |
| 5,630,154 A | 5/1997 | Bolstad et al. | |
| 5,737,369 A | 4/1998 | Retzer | |
| 5,859,551 A | 1/1999 | Ohishi et al. | |
| 5,862,141 A | 1/1999 | Trotter | |
| 5,870,446 A | 2/1999 | McMahan et al. | |
| 5,872,907 A | 2/1999 | Griess et al. | |
| 5,896,391 A | 4/1999 | Solheim et al. | |
| 5,914,903 A | 6/1999 | Kanma et al. | |
| 6,067,256 A | 5/2000 | Yamashita et al. | |
| 6,076,175 A | 6/2000 | Drost et al. | |
| 6,078,627 A | 6/2000 | Crayford | |
| 6,092,217 A | 7/2000 | Kanekawa et al. | |
| 6,114,880 A | 9/2000 | Buer et al. | |
| 6,127,864 A | 10/2000 | Mavis et al. | |
| 6,148,423 A | 11/2000 | Le Mouel et al. | |
| 6,167,526 A | 12/2000 | Carlson | |
| 6,173,423 B1 | 1/2001 | Autechaud et al. | |
| 6,188,610 B1 | 2/2001 | Kakizoe et al. | |
| 6,222,660 B1 | 4/2001 | Traa | |
| 6,282,661 B1 | 8/2001 | Micol | |
| 6,453,431 B1 | 9/2002 | Bernstein et al. | |
| 6,476,643 B2 | 11/2002 | Hugues et al. | |
| 6,523,201 B1 | 2/2003 | De Michele | |
| 6,538,471 B1 * | 3/2003 | Stan et al. | 326/46 |
| 6,650,661 B1 | 11/2003 | Buchanan et al. | |
| 6,693,985 B2 | 2/2004 | Li et al. | |
| 6,741,110 B2 | 5/2004 | Roisen | |
| 6,772,388 B2 | 8/2004 | Cooper et al. | |
| 6,799,292 B2 | 9/2004 | Takeoka et al. | |
| 6,802,033 B1 | 10/2004 | Bertin et al. | |
| 6,831,496 B2 | 12/2004 | Gardner | |
| 6,834,367 B2 | 12/2004 | Bonneau et al. | |
| 6,907,553 B2 | 6/2005 | Popplewell et al. | |
| 6,931,565 B2 | 8/2005 | Hirabayashi | |
| 6,944,067 B2 | 9/2005 | Mudge et al. | |
| 6,944,468 B2 | 9/2005 | Okumura | |
| 6,958,627 B2 | 10/2005 | Singh et al. | |
| 6,977,910 B1 | 12/2005 | Hosur et al. | |
| 6,985,547 B2 | 1/2006 | Uht | |
| 7,002,358 B2 | 2/2006 | Wyatt | |
| 7,010,074 B2 | 3/2006 | Nakamura | |
| 7,023,235 B2 | 4/2006 | Hoff | |
| 7,046,056 B2 | 5/2006 | Kizer et al. | |
| 7,061,294 B1 | 6/2006 | Talledo et al. | |
| 7,073,080 B2 | 7/2006 | Lou | |
| 7,085,993 B2 | 8/2006 | Goodnow et al. | |
| 7,096,137 B2 | 8/2006 | Shipton et al. | |
| 7,096,402 B2 | 8/2006 | Yano et al. | |
| 7,116,744 B2 | 10/2006 | Saze et al. | |
| 7,142,623 B2 | 11/2006 | Sorna | |
| 7,162,661 B2 | 1/2007 | Mudge et al. | |
| 7,188,284 B2 | 3/2007 | Mitra et al. | |
| 7,236,555 B2 | 6/2007 | Brewer | |
| 7,257,173 B2 | 8/2007 | Wood et al. | |
| 7,260,742 B2 | 8/2007 | Czajkowski | |
| 7,278,074 B2 | 10/2007 | Mitra et al. | |
| 7,278,076 B2 | 10/2007 | Zhang et al. | |
| 7,278,080 B2 | 10/2007 | Flautner et al. | |
| 7,310,755 B2 | 12/2007 | Mudge et al. | |
| 7,320,091 B2 | 1/2008 | Blaauw et al. | |
| 7,323,946 B2 | 1/2008 | Seefeldt et al. | |
| 7,337,356 B2 | 2/2008 | Mudge et al. | |
| 7,382,366 B1 | 6/2008 | Klock et al. | |
| 7,401,273 B2 | 7/2008 | Lee et al. | |
| 7,482,831 B2 | 1/2009 | Chakraborty et al. | |
| 7,546,519 B2 | 6/2009 | Agarwal | |
| 7,594,150 B2 | 9/2009 | Chakraborty et al. | |
| 7,650,551 B2 | 1/2010 | Flautner et al. | |
| 7,671,627 B1 | 3/2010 | Somani et al. | |
| 7,782,125 B2 | 8/2010 | Shimura | |
| 7,797,575 B2 | 9/2010 | Clark et al. | |
| 2001/0016927 A1 | 8/2001 | Poisner | |
| 2002/0038418 A1 | 3/2002 | Shimamura | |
| 2004/0130351 A1 | 7/2004 | Hazucha et al. | |
| 2004/0199821 A1 | 10/2004 | Flautner et al. | |
| 2005/0162185 A1 | 7/2005 | Satsukawa | |
| 2006/0050550 A1 | 3/2006 | Petersen et al. | |
| 2006/0126376 A1 | 6/2006 | Plants | |
| 2007/0028157 A1 | 2/2007 | Drake et al. | |
| 2008/0115023 A1 | 5/2008 | Carlson | |
| 2008/0180153 A1 | 7/2008 | Sachdev et al. | |
| 2009/0066386 A1 * | 3/2009 | Lee | 327/202 |
| 2009/0141536 A1 * | 6/2009 | Gonzalez et al. | 365/154 |
| 2010/0080072 A1 | 4/2010 | Krueger et al. | |
| 2010/0088565 A1 | 4/2010 | Chandra | |
| 2011/0126051 A1 | 5/2011 | Flautner et al. | |

FOREIGN PATENT DOCUMENTS

| | | |
|---|---|---|
| EP | 0 653 708 | 5/1995 |
| JP | 60-20398 | 2/1985 |
| JP | 62-24498 | 2/1987 |
| JP | 2001-175542 | 6/2001 |
| SU | 809350 | 2/1981 |
| WO | WO 00/54410 | 9/2000 |
| WO | WO 01/46800 | 6/2001 |
| WO | WO 2004/084072 | 9/2004 |

OTHER PUBLICATIONS

A. Goel et al, "Low-Overhead Design of Soft-Error-Tolerant Scan Flip-Flops with Enhanced-Scan Capability" Design Automation, 2006, Asia and South Pacific Conference, Jan. 2006, pp. 665-670.

R. Oliveira et al, "A TMR Scheme for SEU Mitigation in Scan Flip-Flops" Proceedings of the 8th International Symposium on Quality Electronic Design (ISQED'07), Mar. 2007, pp. 905-910.

M. Zhang et al, "Sequential Element Design With Built-In Soft Error Resilience" IEEE Transactions on Very Large Scale Integration (VLSI) Systems, vol. 14, No. 12, Dec. 2006, pp. 1368-1378.

S.V. Devarapalli et al, "SEU-hardened Dual Data Rate Flip-Flop Using C-elements" 2010 IEEE 25th International Symposium on Defect and Fault Tolerance in VLSI Systems, Oct. 2010, pp. 167-171.

Drake et al., "A Self-Correcting Soft Error Tolerant Flop-Flop", *12th NASA Symposium*, Oct. 2005, 5 pages.

Hill et al. "An Accurate Flip-Flop Selection Technique for Reducing Logic SER", *Dept. of Electrical and Computer Engineering—Univ. of Wisconsin*, No Date, pp. 1-9.

Rockett, "An SEU-Hardened CMOS Data Latch Design", *IEEE Transactions on Nuclear Sciences*, vol. 35, No. 6, Dec. 1998, pp. 1682-1687.

Karnik et al., "Characterization of Soft Errors Caused by Single Event Upsets in CMOS Processes", *IEEE Transactions on Dependable and Secure Computing*, vol. 1, No. 2, Apr. 2004, pp. 128-143.

Zhang et al., "Sequential Element Design With Built-In Soft Error Resilience", *IEEE Transactions on VLSI Systems*, vol. 14, No. 12, Dec. 2006, pp. 1368-1378.

Li et al., "Low Power Dissipation SEU-hardened CMOS Latch", *PIERS Online*, vol. 3, No. 7, 2007, pp. 1080-1084.

Dabiri et al., "Soft Error-Aware Power Optimization using Gate Sizing", *Computer Science Dept.—Univ. of California*, No Date, pp. 1-10.

Zhang et al., "Design for Resilience to Soft Errors and Variations", *IEEE Computer Society*, 2007, 6 pages.

Huang et al., "A New Radiation Hardened by Design Latch for Ultra-Deep-Sub-Micron Technologies", *IEEE Computer Society*, 2008, pp. 175-176.

Das et al., "RazorII: In Situ Error Detection and Correction for PVT and SER Tolerance", *IEEE Journal of Solid-State Circuits*, vol. 44, No. 1, Jan. 2009, pp. 32-48.

Jagirdar et al., "A Robust Architecture for Flip-Flops Tolerant to Soft-Errors and Transients from Combinational Circuits", *IEEE Computer Society*, 2008, pp. 39-44.

Calin et al., "Upset Hardened Memory Design for Submicron CMOS Technology", *IEEE Transactions on Nuclear Science*, vol. 43, No. 6, Dec. 1996, pp. 2874-2878.

Naseer et al., "DF-DICE: A Scalable Solution for Soft Error Tolerant Circuit Design", *ISCAS* 2006, pp. 3890-3893.

Jargirdar et al., "Efficient Flip-Flop Designs for SET/SEU Mitigation with Tolerance to Crosstalk Induced Signal Delays", *Rutgers University*, 24 pages.

Giacomotto et al., "Energy Efficiency of Power-Gating in Low-Power Clocked Storage Elements", *PATMOS Proceedings*, No Date, 9 pages.

Goel et al, "Low-Overhead Design of Soft-Error-Tolerant Scan Flip-Flops with Enhanced-Scan Capability", *IEEE*, 2006, pp. 665-670.

S. Das, "Razor: A Variability-Tolerant Design Methodology for Low-Power and Robust Computing", *Computer Science and Engineering—Univ. of Michigan*, 2009, pp. 1-122.

K. Seshadri, "Reduction of Architecture Vulnerability Factor using Modified Razor Flip-flops", *Dept. of Electrical and Computer Engineering—Univ. of Maryland*, 2007, pp. 1-61.

Mitra et al., "Robust System Design with Built-in Soft-Error Resilience", *IEEE Computer Society*, Feb. 2005, pp. 43-52.

Calin et al, "Upset-Tolerant CMOS SRAM Using Current Monitoring: Prototype and Test Experiments", *International Test Conference IEEE 1995*, pp. 45-.

U.S. Appl. No. 12/285,517, filed Oct. 7, 2008, Chandra.

A.J. Drake et al, "A Self-Correcting Soft Error Tolerant Flop-Flop" 12th NASA Symposium on VLSI Design, Oct. 2005.

A. Venkatraman et al, "A Robust, Fast Pulsed Flip-Flip Design" *GLSVLSI'08*, May 2008, pp. 119-122.

S. Mitra et al, "Built-In Soft Error Resilience for Robust System Design" IEEE, 2007, pp. 1-6.

S. Mitra "Built-In Soft Error Resilience for Robust System Design" power point presentation pp. 1-34 & 36-45 www.ewh.ieee.org/r6/scv/r1/articles/ser.talk.grid.v1.pdf.

U.S. Appl. No. 11/636,716, filed Dec. 11, 2006, Das et al.

U.S. Appl. No. 12/078,189, filed Mar. 27, 2008, Chandra et al.

U.S. Appl. No. 12/461,740, filed Aug. 21, 2009, Blaauw et al.

U.S. Appl. No. 12/923,911, filed Oct. 13, 2010, Flautner et al.

U.S. Appl. No. 12/923,908, filed Oct. 13, 2010, Flautner et al.

U.S. Appl. No. 12/926,084, filed Oct. 25, 2010, Flautner et al.

Office Action mailed Jun. 23, 2010 in co-pending U.S. Appl. No. 11/636,716.

Office Action mailed Aug. 3, 2011 in co-pending U.S. Appl. No. 12/923,911.

Final Office Action mailed Dec. 7, 2010 in co-pending U.S. Appl. No. 11/636,716.

Office Action mailed Jul. 13, 2011 in co-pending U.S. Appl. No. 11/636,716.

Office Action mailed Aug. 29, 2011 in co-pending U.S. Appl. No. 12/078,189.

S. Mitra et al, "Logic Soft Errors in Sub-65nm Technologies Design and CAD Challenges" *DAC 2005*, Jun. 2005, pp. 2-4.

P. Hazucha et al, "Measurements and Analysis of SER-Tolerant Latch in a 90-nm Dual-$V_T$ CMOS Process" *IEEE Journal of Solid-State Circuits*, vol. 39, No. 9, Sep. 2004, pp. 1536-1543.

S. Mitra et al, "Robust System Design with Built-In Soft-Error Resilience" IEEE Computer Society Feb. 2005, pp. 43-52.

M. Keating et al, "Low Power Methodology Manual for System-on-Chip Design" p. 216.

V. Chandra et al, "Impact of Technology and Voltage Scaling on the Soft Error Susceptibility in Nanoscale CMOS" *DFTVS '08*, IEEE International Symposium on Defect and Fault Tolerances of VLSI Systems, 2008.

N. Kanekawa et al, "Fault Detection and Recovery Coverage Improvement by Clock Synchronized Suplicated Systems with Optimal Time Diversity" *Fault-Tolerant Computing*, Jun. 1998, pp. 196-200.

"ARM710 Data Sheet" Dec. 1994, Advanced RISC Machines Ltd. (ARM).

F. Worm et al, "An Adaptive Low-Power Transmission Scheme for On-Chip Networks" *ISSS'02*, Oct. 2002, pp. 92-100.

Enomoto et al, "A low-power, high speed 0.25µm GaAs D-FF" Proceedings of the 23rd European Solid-State Circuits Conference, 1997, ESSCIRC '97, Sep. 16-18, 1997, pp. 300-303.

Office Action mailed Aug. 9, 2012 in co-pending U.S. Appl. No. 12/923,908.

UK Search Report dated Jul. 18, 2012 in GB 1203249.6.

Office Action mailed Mar. 15, 2013 in co-pending U.S. Appl. No. 12/926,084.

\* cited by examiner

STORAGE CIRCUITRY AND METHOD WITH INCREASED RESILIENCE TO SINGLE EVENT UPSETS

BACKGROUND OF THE INVENTION

1. Field of the Invention

The present invention relates to storage circuitry and a method of operation of such storage circuitry, which provides increased resilience to single event upsets.

2. Description of the Prior Art

Storage elements in data processing systems are susceptible to single event upsets (SEUs), such an SEU causing a change of state in the stored data due to ions or electromagnetic radiation striking a sensitive node within the device and causing the state to flip. Many different approaches have been proposed in the prior art literature to seek to achieve SEU robustness in storage cells.

For example, one known prior art technique is referred to as built-in soft error resilience (BISER). In accordance with a BISER technique, a data signal is sampled using two conventional master-slave flip-flops, and the output of the two flip-flops are then passed through a C-element. The C-element will only allow a data value to propagate from its output if the output of the two flip-flops match. Since an SEU will only typically affect one of the flip-flops, this ensures that the output propagated from the C-element does not change in the presence of an SEU. Such BISER techniques are described for example in the article by Zhang, M., Mitra, S., Mak, T. M., Seifert, N., Wang, N. J., Shi, Q., Kim, K. S., Shanbhag, N. R., and Patel, S. J., entitled "Sequential element design with built-in soft error resilience", IEEE Trans. Very Large Scale Integration Systems, Volume 4, Issue 12 (December 2006), pages 1368-1378, and the article by Ming Zhang, T. M. Mak, Jim Tschanz, Kee Sup Kim, Norbert Seifert, and Davia Lu, entitled "Design for Resilience to Soft Errors and Variations," IEEE International On-Line Testing Symposium, pages 23-28, 13th IEEE International On-Line Testing Symposium (IOLTS 2007), 2007.

Another technique which also uses C-elements is referred to as radiation hardened by design (RHBD). An RHBD latch design uses three C-elements, an example of such a design being described in the article by Huang, Z. and Liang, H, entitled "A New Radiation Hardened by Design Latch for Ultra-Deep-Sub-Micron Technologies", Proceedings 14th IEEE International On-Line Testing Symposium, IOLTS, IEEE Computer Society, Washington, D.C., pages 175-176.

Another known prior art technique involves providing functional circuitry within a data processing apparatus with error correction circuitry that is able to detect errors in operation of the functional circuitry and repair those errors in operation. Such an error correction circuit can be embodied in a variety of ways, but in one embodiment may take the form of a single event upset (SEU) tolerant flip-flop such as discussed in commonly owned U.S. Pat. No. 7,278,080, the entire contents of which are hereby incorporated by reference, this patent describing a design technique sometimes referred to as "Razor". In accordance with the basic Razor technique, errors are detected in the processing stages by comparison of a non-delayed data value with a delayed data value, these data values being captured at slightly different times. Whilst the primary use of the Razor technique is to provide delay-error tolerant flip-flops on critical paths to allow the supply voltage to be scaled to the point of first failure (PoFF) of a die for a given frequency (thus reducing unnecessary margin in a design), it will be appreciated that such a technique also allows SEUs to be detected and corrected in situ. A further paper that describes the Razor technique is "Razor II: In-Situ Error Detection and Correction for PVT and SER Tolerance", IEEE Journal of Solid-State Circuits (JSSC), Volume 44, No. 1, January 2009.

In accordance with another known design referred to as XSEUFF, redundancy available in scan flip-flops is used, and a majority voting circuit is used to correct errors due to SEUs. Although re-using scan flip-flops saves area, dynamic power overhead is high due to switching activity in the scan flip-flops. Such a technique is described in the article by Jagirdar, A., Oliveira, R., and Chakraborty, T. J., entitled "A Robust Architecture for Flip-Flops Tolerant to Soft-Errors and Transients from Combinational Circuits", Proceedings of the 21st international Conference on VLSI Design, Jan. 4-8, 2008, pages 39-44.

Commonly owned U.S. patent application Ser. No. 12/285,517, the entire contents of which are hereby incorporated by reference, describes a self-correcting flip-flop design where two extra latches are added, and majority voting is performed to mask a soft error. Such a self-correcting flip-flop increases power overhead, and also increases the clock-Q latency of a conventional master-slave flip-flop.

Another known prior art technique is referred to as a dual interlocked storage cell (DICE). A DICE cell has a number of interlocked P and N transistors which are arranged in such a manner that if a single event upset affects a single node, the remaining transistors within the design will cause the affected node to self-correct. Hence, in accordance with the DICE technique, a number of redundant nodes are provided in order to improve robustness to SEUs. However, each storage element in accordance with such a technique is relatively large and has high power consumption and a significant delay overhead when compared to a conventional master-slave flip-flop. DICE-style cells are described in a number of articles, for example the article by T. Calin, M. Nicolaidis, and R. Velazco, entitled "Upset hardened memory design for submicron CMOS technology", IEEE Transactions on Nuclear Science, Vol. 43, No. 6, pages 2874-2878, 1996, the article by R. Naseer, and J. Draper, entitled "DF-DICE: a scalable solution for soft error tolerant circuit design", Proceedings of the International Symposium on Circuits and Systems, May 2006, pages 3890-3893, and the article by Li, Y., S. Yue, Y. Zhao, and G. Liang, entitled "Low power dissipation SEU-hardened CMOS latch," PIERS Online, Vol. 3, page 1080, 2007.

From the above discussion of known prior art techniques, it will be appreciated that most of these approaches add one or more extra sequential elements (either another master-slave flip-flop or an extra latch) in order to detect an error due to a single event upset, thereby giving rise to an increase in area and power consumption. Further, in accordance with such techniques, error correction is achieved either by using a rollback or instruction replay technique, or by adding glue logic to the sequential element (such as the earlier described C-element), which further increases power overhead and the clock-Q delay.

Accordingly, it would be desirable to provide an improved technique for providing resilience to single event upsets within a storage circuit.

SUMMARY OF THE INVENTION

Viewed from a first aspect, the present invention provides storage circuitry comprising: a first storage block configured in at least one mode of operation to perform a first storage function; a second storage block configured in at least one mode of operation to perform a second storage function distinct from said first storage function; and configuration circuitry arranged to be responsive to a predetermined mode of operation where said second storage function is unused, to configure said second storage block to operate in parallel with said first storage block to increase resilience of said first storage block to single event upsets (SEUs) whilst performing said first storage function.

In accordance with the present invention, a second storage block already present within the storage circuitry to perform a particular storage function during at least one mode of operation is re-used to improve the resilience of a first storage block when in a mode of operation where the second storage block's storage function is otherwise unused. In particular, configuration circuitry is arranged to be responsive to a predetermined mode of operation where the second storage function of the second storage block is unused, to configure that second storage block to operate in parallel with the first storage block to increase the resilience of the first storage block to single event upsets. By arranging the two storage blocks in parallel when one of the storage blocks is otherwise performing no useful function, this in effect increases the size of the storage block that is still performing the useful storage function, and as a result increases its resilience to single event upsets.

Hence, in contrast to prior art techniques which seek to provide the ability to recover from a single event upset when it occurs, the present invention instead seeks to make the storage block more resilient to single event upsets in the first place, so that they are much less likely to occur. Further, this is achieved by re-using a storage block already provided by the storage circuitry, thereby requiring only a small amount of additional circuitry to implement the functionality of the configuration circuitry. Such an approach hence has minimal area and power consumption overhead, and provides a small storage circuit that can be readily used in a wide variety of sequential cell designs.

In one embodiment, the first storage block is configured as a latch to perform said first storage function, and in said predetermined mode of operation, the configuration circuitry is arranged to configure the second storage block as an additional latch in parallel with the first storage block, such that the first storage block and the second storage block collectively form a twin latch for performing the first storage function during said predetermined mode of operation. It has been found that such an approach significantly increases the resilience of the storage circuitry to single event upsets when performing the first storage function during the predetermined mode of operation.

The first and second storage blocks can take a variety of forms, and indeed the predetermined mode of operation in which they operate in parallel to improve resilience to single event upsets can be a number of modes. However, in one embodiment, the first storage block is configured to perform said first storage function by operating as a master latch of a flip-flop during a normal mode of operation, and said second storage block is configured to perform said second storage function by operating as a slave latch of said flip-flop during said normal mode of operation. In such an embodiment, the predetermined mode of operation may be a standby mode of operation where the first storage block performs the first storage function to retain a data value, and the second storage function is unused. Hence, in the standby mode of operation, the master latch is used to retain a data value, and the slave latch would traditionally be unused. However, in accordance with this embodiment of the present invention, instead of leaving the slave latch unused, it is instead reconfigured in the standby mode of operation so as to operate as a latch in parallel with the master latch to create a twin latch with increased resilience to single event upsets.

Whilst in the above embodiment, it is the master latch that is used during the standby mode of operation, it will be appreciated that in an alternative mode of operation, it can be the slave latch that is used during the standby mode of operation to retain the data value, in which case the master latch is then the latch that is reconfigured during the standby mode of operation to operate in parallel with the slave latch to provide the above-described twin latch.

In addition to use of the technique in association with master-slave flip-flops, the technique can also be used in storage circuits that provide a state retention mode. Typically, such storage circuits include an additional latch which is used in the state retention mode to retain a data value whilst the rest of the storage circuit is powered down. In accordance with one embodiment, such a state retention latch can be used as the second storage block, and can be configured during a normal mode of operation to be configured in parallel with a latch of the flip-flop in order to increase the resilience of that latch to single event upsets. Hence, in this embodiment, improved resilience is achieved during the normal mode of operation through re-use of a state retention latch that would otherwise be un-used during the normal mode of operation.

The state retention latch can be coupled in parallel with any suitable latch of the storage circuit used during the normal mode of operation, but in one embodiment is connected in parallel with the master latch of the flip-flop during the normal mode of operation to thereby increase the resilience of the master latch to single event upsets during the normal mode of operation.

In one embodiment, both of the earlier described techniques can be used so as to increase resilience of one of the master and slave latches during the normal mode of operation through use of the state retention latch (which is otherwise unused in the normal mode of operation), and then when entering a standby mode of operation, the one of the master and slave latches which would otherwise be unused in the standby mode is coupled in parallel with the other of the master and slave latches that is used in the standby mode so as to also increase resilience to single event upsets during the standby mode.

In particular, in one embodiment, the first storage block is configured to perform said first storage function by operating as one of a master latch and a slave latch of a flip-flop during said normal mode of operation, and the storage circuitry further comprises: a third storage block configured in said normal mode of operation to perform a third storage function by operating as the other of the master latch and the slave latch of said flip-flop, so that collectively said first storage block and said third storage block provide the master latch and the slave latch of the flip-flop during said normal mode of operation. In a standby mode of operation, said third storage function is then unused, and the configuration circuitry is further arranged to be responsive to said standby mode of operation to configure the third storage block to operate in parallel with the first storage block to increase resilience of the first storage block to single event upsets whilst performing said first storage function during said standby mode of operation.

The configuration circuitry can take a variety of forms. However, in one embodiment the configuration circuitry comprises switch circuitry that is responsive to a current mode of operation being said predetermined mode of operation to switch said second storage block into a parallel arrangement with respect to said first storage block.

In one particular embodiment, the switch circuitry is further responsive to said current mode of operation not being said predetermined mode of operation to switch said second storage block into a serial arrangement with respect to said first storage block. This approach can, for example, be used where the first and second storage blocks are formed by the master and slave latches of a flip-flop, such that during the normal mode of operation those two storage blocks are connected in series, whilst in the standby mode of operation those two storage blocks are connected in parallel and both enabled as latches at the same time.

In one embodiment, the configuration circuitry further comprises control circuitry for generating an internal signal from a clock signal provided to said configuration circuitry, and said second storage block includes a switch element which is controlled by the internal signal to selectively configure the second storage block as a latch dependent on a value of said internal signal. As a result, when the current mode of operation is said predetermined mode of operation, the switch circuitry switches said second storage block into a parallel arrangement with respect to said first storage block, and the internal signal is set to a value causing the switch element to configure the second storage block as a latch. Hence, in such embodiments, the internal signal can be used to configure the second storage block as a latch even if it would not normally be configured as a latch during the predetermined mode of operation. Such an approach is useful where the first and second storage blocks are the master and slave latches of flip-flop, since without the above approach it would typically be the case that in the standby mode of operation the second storage block would not be configured as a latch.

In an alternative embodiment, the switch circuitry may be responsive to the current mode of operation not being said predetermined mode of operation to decouple said second storage block from said first storage block. Hence, in such embodiments, when in the predetermined mode of operation, the first and second storage blocks are connected in parallel, and when not in the predetermined mode of operation, the first and second storage blocks are decoupled. Such an approach can be used for the earlier described example where the first storage block is either the master or slave latch of a flip-flop, and the second storage block is a state retention latch.

Viewed from a second aspect, the present invention provides a method of operating storage circuitry having a first storage block configured in at least one mode of operation to perform a first storage function, and a second storage block configured in at least one mode of operation to perform a second storage function distinct from said first storage function, the method comprising: responsive to a predetermined mode of operation where said second storage function is unused, configuring said second storage block to operate in parallel with said first storage block to increase resilience of said first storage block to single event upsets whilst performing said first storage function.

Viewed from a third aspect, the present invention provides storage circuitry comprising: a first storage means for performing a first storage function in at least one mode of operation; a second storage means for performing a second storage function in at least one mode of operation, the second storage function being distinct from said first storage function; and configuration means, responsive to a predetermined mode of operation where said second storage function is unused, for configuring said second storage means to operate in parallel with said first storage means to increase resilience of said first storage means to single event upsets (SEUs) whilst performing said first storage function.

BRIEF DESCRIPTION OF THE DRAWINGS

The present invention will be described further, by way of example only, with reference to embodiments thereof as illustrated in the accompanying drawings, in which.

DESCRIPTION OF EMBODIMENTS

Figure 1:
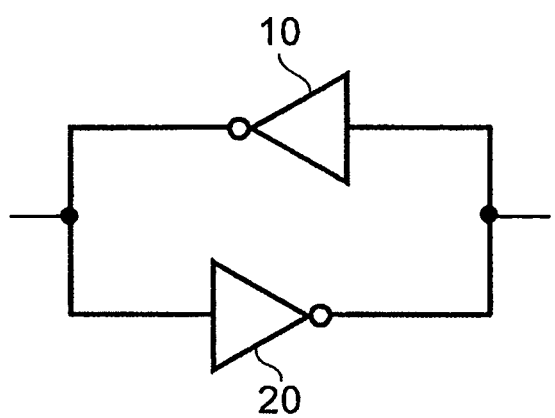
FIG. 1 is a diagram illustrating a conventional single-bit storage cell.
Figure 2:
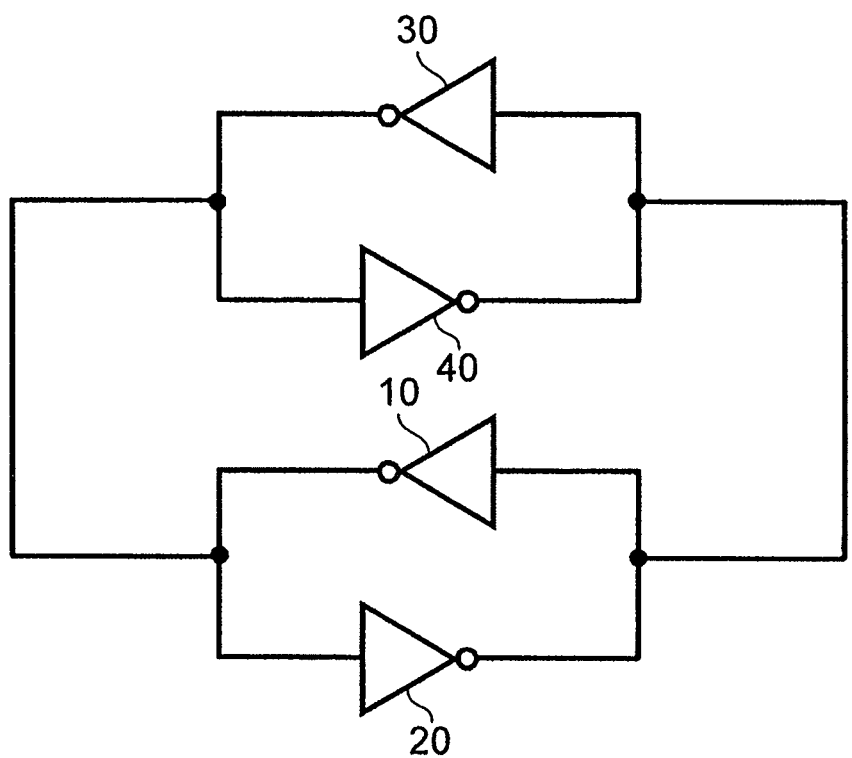
FIG. 2 is a diagram schematically illustrating a twin latch arrangement used in embodiments.

FIG. 1 schematically illustrates a conventional single bit storage cell, where two inverters 10, 20 are connected so as to form a latch. Such latches are used in many sequential storage circuits in data processing systems, and often two such latches are provided in series to create a flip-flop. In the embodiments described below, a latch that is already provided to perform a storage function in one mode of operation is re-used to create a twin latch in another mode of operation where it would otherwise be unused. FIG. 2 shows such a twin latch, where it can be seen that a further latch consisting of inverters 30, 40 is arranged to operate in parallel with the latch of FIG. 1. Such a twin latch is inherently more resilient to single event upsets (SEUs), for the reasons discussed below.

If the critical charge required to flip a bit stored in a conventional latch storage cell is $Q_{crit}$, then the critical charge required to flip a bit stored in a twin latch storage cell is $2Q_{crit}$.

Soft error rate (SER) has an exponential dependence on Qcrit, as discussed in the article by Foad Dabiri, Ani Nahapetian, Tammara Massey, Miodrag Potkonjak, and Majid Sarrafzadeh, entitled "Soft Error-Aware Power Optimization using Gate Sizing". IEEE Transaction on Computer Aided Design (TCAD), Vol 27. No. 10. October 2008. In particular:

$$SER = F \times A \times e^{-Qcrit/Qs}$$

where F is the neutron flux with energy >=1 MeV in particles/ (cm²s), A is the area of the circuit sensitive to particle strikes (the sensitive area is the area of the source of the transistors which is a function of gate size), in $cm^2$, Qcrit is the critical charge in fC, and QS is the charge collection efficiency of the device in fC.

Accordingly, a twin storage cell has a much smaller FIT (failure in time) rate even though it has twice the area.

A master-slave edge triggered flip-flop, frequently used to store system state in sequential designs, is made of two latches, namely a master latch and a slave latch, connected in series. During normal operation, at every clock edge, the master latch captures a newly computed value, and the slave latch holds the old value of the master. However, during standby mode, when the system state does not change, one of the latches (typically the master latch) retains state, whilst the other latch (typically the slave latch) performs no storage function. In the embodiment described below with reference to FIGS. 3A and 3B, the fact that the slave latch is not used during standby mode is taken advantage of, by reconfiguring the slave latch in standby mode so that it operates in parallel with the master latch to create a twin latch, thereby making the flip-flop more robust to single event upsets during the standby mode of operation.

Figure 3A:
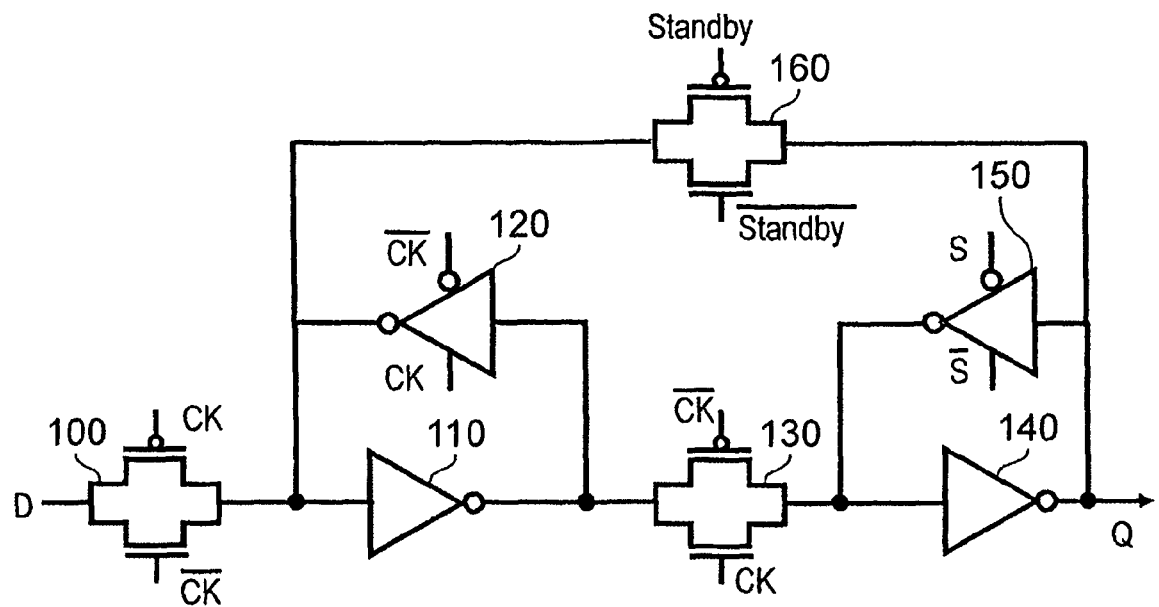
FIG. 3A illustrates the construction of a master-slave flip-flop in accordance with an embodiment.

As shown in FIG. 3A, the coupled inverters 110, 120 provide the functionality of the master latch, whilst the coupled inverters 140, 150 provide the functionality of the slave latch. As with a conventional master-slave flip-flop, two switch elements 100, 130 are provided, switch 100 being open when the clock is high and closed when the clock is low, and switch 130 being closed when the clock is high and open when the clock is low.

However, in contrast to a typical master-slave flip-flop, an additional switching element 160 is provided which, when the standby mode is de-asserted (which in this embodiment is when the standby signal is at a logic one level), is placed in the open state, but when the standby mode is asserted (i.e. the standby signal goes to a logic zero level), the switch 160 closes to connect the master and slave latches in parallel.

Figure 3B:
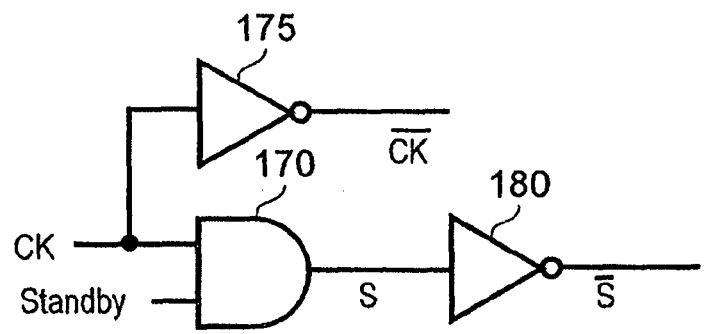
FIG. 3B is a diagram illustrating components used to generate the various signals used to control elements of the master-slave flip-flop of FIG. 3A in accordance with one embodiment.

In addition, the inverter 150 as used in the embodiment of FIG. 3A is not directly controlled by the clock signal (likes its counterpart inverter 120 in the master latch), but instead is controlled by the signals generated by the circuitry of FIG. 3B (which in combination with the switch 160 forms configuration circuitry). As will be seen from FIG. 3B, when the standby mode is de-asserted (standby equals one), the internal signal S is the same as the clock signal CK, in that when the clock signal is low (a logic zero level), the internal signal S will also be low, whereas when the clock signal is high (a logic one level), the internal signal S will also be high. As a result, it will be appreciated that the circuitry of FIG. 3A acts as a standard master-slave flip-flop when not in the standby mode of operation.

Prior to entering the standby mode of operation, it is assumed in the embodiment of FIGS. 3A and 3B that the clock signal will be set to a logic one level, this being typical practice prior to entering standby mode. When the standby mode is then activated (standby signal transitions to a logic zero level), it will be seen from FIG. 3B that this causes the internal signal S to transition to a logic zero value, such that the internal signal S becomes equivalent to the inverse of the clock signal. As a result, it will be seen that in the standby mode of operation the switch 160 closes and in addition the inverter 150 is turned on causing the components 140, 150 to form a latch. Also, the components 110, 120 form a latch due to the clock signal being high. Accordingly, it can be seen that in the standby mode of operation, the circuitry of FIG. 3A adopts the twin latch structure discussed earlier with reference to FIG. 2, thereby improving the resilience of the master latch to single event upsets during the standby mode of operation.

Figure 4A:
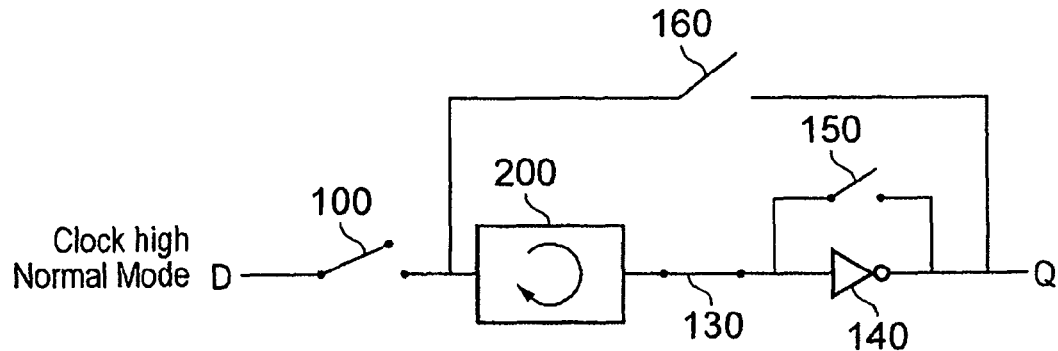
FIGS. 4A to 4C schematically illustrate the operation of the circuitry of FIG. 3A in normal mode and standby mode in accordance with one embodiment.
Figure 4B:
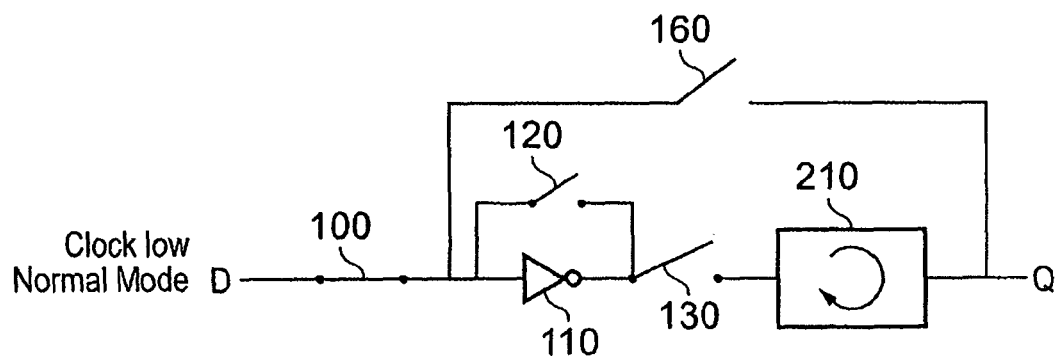
Figure 4C:
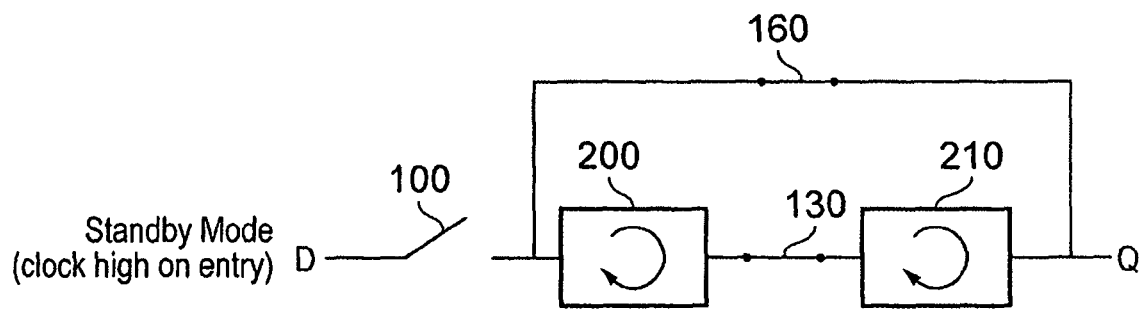

FIGS. 4A to 4C schematically illustrate the operation of the circuitry of FIG. 3A in both the normal mode of operation and the standby mode. In particular, FIG. 4A illustrates the operation of the circuitry of FIG. 3A during a normal mode of operation, during a half cycle where the clock signal is high. In this event, the inverter 120 is turned on, causing the inverters 110, 120 to collectively form the master latch 200 shown in FIG. 4A. However, the inverter 150 is not turned on, and accordingly becomes an open switch. As a result, the inverter 140 just acts as a buffer between the output of the master latch 200 and the output of the circuit. Also during this time, the switch 100 is open, the switch 130 is closed and the switch 160 is open.

As shown in FIG. 4B, during the half cycle when the clock is low, the inverter 120 is not driven, and accordingly the components 110, 120 do not act as a latch during this phase. However, the inverter 150 is driven, and accordingly the inverters 140 and 150 form the slave latch 210, which then holds the value that was present in the master latch 200 at the time the clock signal transitioned from the high state to the low state. During this half cycle of the clock, the switch 100 is closed, and the switches 130 and 160 are open. Hence the slave latch 210 provides at the output Q the value that was latched in the master latch 200 during the first half of the clock cycle, whilst during the second half of the clock cycle the inverter 110 samples the value at the input D to the circuit, but does not latch that input value.

Accordingly, from the above discussion of FIGS. 4A and 4B, it will be appreciated that the circuitry of FIG. 3A acts like a standard master-slave flip-flop during the normal mode of operation.

FIG. 4C then illustrates the operation of the circuitry during the standby mode. As discussed earlier, it is assumed that the clock signal is set high prior to entry to the standby mode. Accordingly, the inverters 110, 120 form the master latch 200, the switch 100 is open and the switch 130 is closed. When the standby mode is asserted (the standby signal is zero), the switch 160 also closes. In addition, the inverter 150 becomes driven, and accordingly the inverters 140, 150 form the slave latch 210. As a result, it will be appreciated that the circuitry then operates as a twin latch to ensure that the value stored is more resilient to single event upsets.

In an alternative embodiment, the circuitry can be arranged such that the slave latch retains the state during the standby mode (typically the clock being set to a logic low level prior to entry to the standby mode in that embodiment). In that case, the inverter 150 would be arranged to be driven directly by the clock signals, and a variant of the circuitry of FIG. 3B would be used to generate control signals for the inverter 120, such that in the normal mode of operation the circuit operates as a standard master-slave flip-flop, and then in the standby mode of operation the components 110, 120 are configured to operate as a latch in parallel with the slave latch 210.

Figure 5:
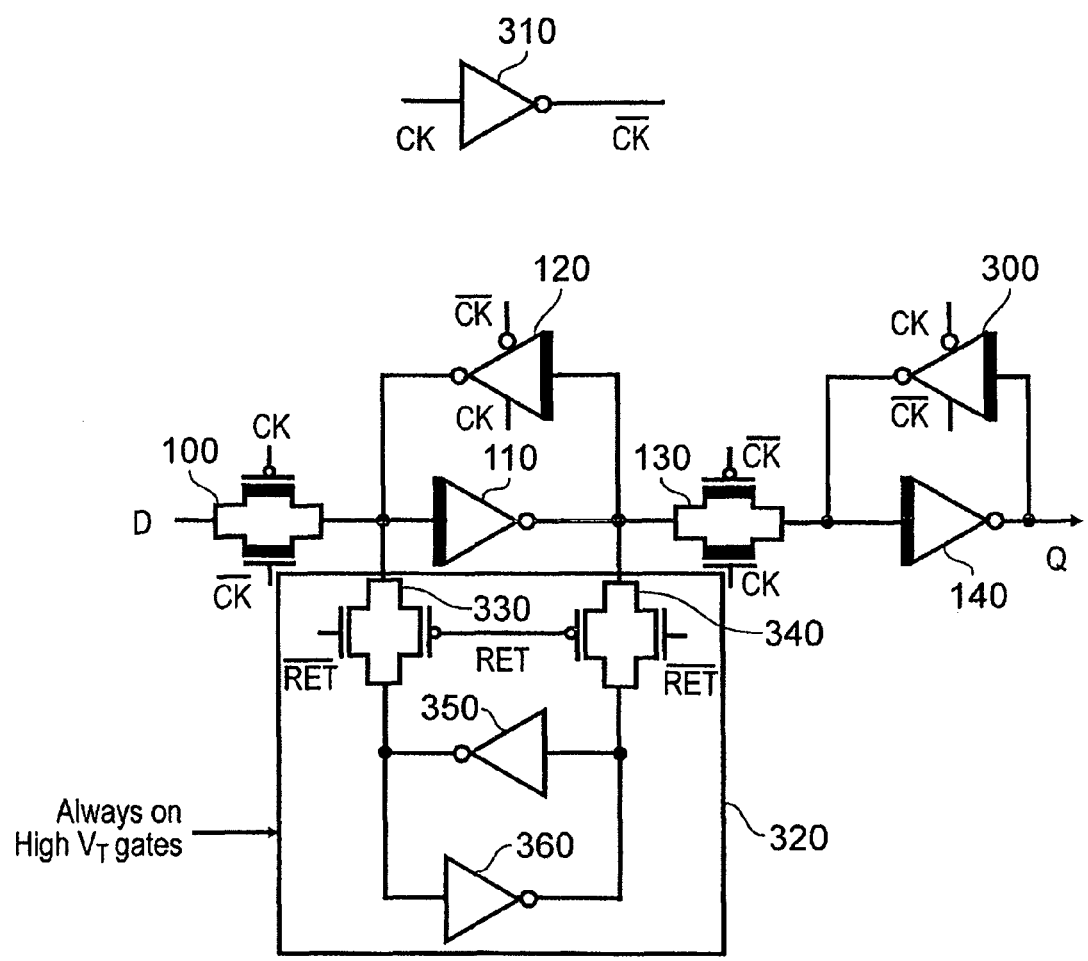
FIG. 5 illustrates the construction of a state retention flip-flop in accordance with one embodiment.

FIG. 5 illustrates an alternative embodiment, where the storage circuitry forms a state retention circuit. Components that are the same as described earlier with reference to FIG. 3A are denoted with the same reference signs. In this example, the master-slave flip-flop is standard so the inverter 150 of FIG. 3A that was driven by the signal S is now replaced by the inverter 300 driven in a standard manner by the clock signal (it will be appreciated that in practice the two inverters will be identical and just driven by different signals).

The components within the box 320 are also provided in this embodiment, these consisting of a state retention latch formed by the inverters 350, 360, and configuration circuitry formed by the two switches 330, 340. These components are constructed using transistors having a high threshold voltage across their gates, so as to minimize leakage when these components are permanently on. In a state retention mode of operation where the RET signal is asserted at a high level, the switches 330, 340 are open, and hence decouple the state retention latch from the rest of the circuit. At this time, the rest of the circuit is powered down, leaving the content of the master latch saved in the state retention latch. The components within the box 320 remain powered during the state retention mode. Such an approach can give rise to significant energy consumption savings whilst still enabling state to be retained.

When the state retention mode is exited, and normal mode resumes, the master-slave flip-flop is powered back up and the transition of the RET signal to the logic low level causes the switches 330, 340 to close and reconnect the state retention latch with the master latch, causing the contents of the state retention latch to be transferred back into the master latch. Normal operation can then resume. However, it should be noted that in accordance with this embodiment, the state retention latch (which in the normal mode of operation is otherwise unused) is now coupled in parallel across the master latch, with the effect that a twin latch is formed, making the master latch's storage function much more resilient to SEUs.

Figure 6:
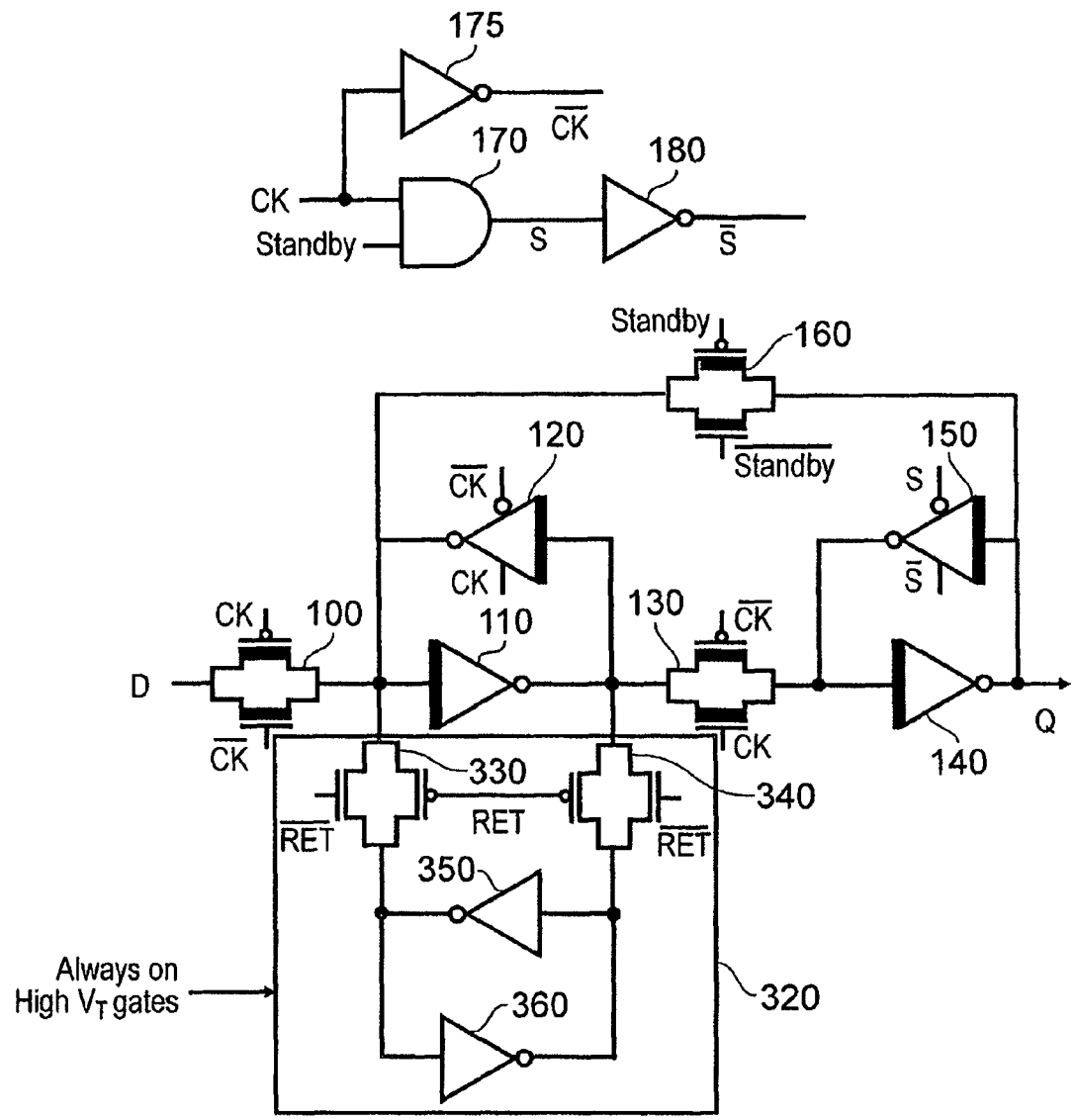
FIG. 6 illustrates the construction of a state retention flip-flop in accordance with an alternative embodiment.

FIG. 6 illustrates another embodiment, where the functionality of FIGS. 3A and 5 are combined. In this embodiment the state retention latch 350, 360 forms a twin latch with the master latch 110, 120 during the normal mode of operation, and in the standby mode the slave latch 140, 150 forms a twin latch with the master latch 110, 120, thereby improving resilience of the master latch to SEUs in both the normal mode and the standby mode.

From the above description of embodiments, it will be seen that such embodiments provide a particularly simple and effective mechanism for increasing the robustness of storage circuitry to single event upsets. The approach described in the embodiments reuses in a particular mode of operation storage blocks that would otherwise not be used in that mode of operation, so as to create a twin latch arrangement, such a twin latch exhibiting significantly improved robustness to single event upsets. As a result, the storage circuitry of such embodiments can be achieved with very little increase in area and power consumption, thereby making it an attractive solution in a wide variety of implementations of sequential storage cells.

Although particular embodiments have been described herein, it will be appreciated that the invention is not limited thereto and that many modifications and additions thereto may be made within the scope of the invention. For example, various combinations of the features of the following dependent claims could be made with the features of the independent claims without departing from the scope of the present invention.

We claim:

1. Storage circuitry comprising:
a first storage block configured, in at least one mode of operation, to store data to perform a first function;
a second storage block configured, in at least one mode of operation, to store said data to perform a second function distinct from said first function; and
configuration circuitry, responsive to a predetermined mode of operation where said second function is unused, to re-configure said second storage block to store said data in parallel with said first storage block data to increase resilience of said first storage block to single event upsets (SEUs) whilst performing said first function during said predetermined mode of operation, wherein:
one of said at least one modes of operation is a normal mode of operation;
said first storage block is configured to perform said first function by operating as a master latch of a flip-flop during said normal mode of operation, and said second storage block is configured to perform said second function by operating as a slave latch of said flip-flop during said normal mode of operation;
said predetermined mode of operation is a standby mode of operation where said first storage block performs said first function to retain a data value, and said second function is unused.

2. Storage circuitry as claimed in claim 1, wherein:
said first storage block is configured as a latch to perform said first function;
in said predetermined mode of operation, said configuration circuitry is arranged to re-configure said second storage block as an additional latch in parallel with said first storage block, such that said first storage block and said second storage block collectively form a twin latch for performing said first function during said predetermined mode of operation.

3. Storage circuitry as claimed in claim 1, wherein said configuration circuitry comprises switch circuitry that is responsive to a current mode of operation being said predetermined mode of operation to switch said second storage block into a parallel arrangement with respect to said first storage block.

4. Storage circuitry as claimed in claim 3, wherein said switch circuitry is responsive to said current mode of operation not being said predetermined mode of operation to decouple said second storage block from said first storage block.

5. Storage circuitry comprising:
a first storage block configured, in at least one mode of operation, to store data to perform a first function:
a second storage block configured, in at least one mode of operation, to store said data to perform a second function distinct from said first function; and
configuration circuitry, responsive to a predetermined mode of operation where said second function is unused, to re-configure said second storage block to store said data in parallel with said first storage block data to increase resilience of said first storage block to single event upsets (SEUs) whilst performing said first function during said predetermined mode of operation, wherein:
one of said at least one modes of operation is a normal mode of operation;
said first storage block is configured to perform said first function by operating as a slave latch of a flip-flop during said normal mode of operation, and said second storage block is configured to perform said second function by operating as a master latch of said flip-flop during said normal mode of operation;
said predetermined mode of operation is a standby mode of operation where said first storage block performs said first function to retain a data value, and said second function is unused.

6. Storage circuitry comprising:
a first storage block configured, in at least one mode of operation, to store data to perform a first function;
a second storage block configured, in at least one mode of operation, to store said data to perform a second function distinct from said first function; and
configuration circuitry, responsive to a predetermined mode of operation where said second function is unused, to re-configure said second storage Hock to store said data in parallel with said first storage block data to increase resilience of said first storage block to single event upsets (SEUs) whilst performing said first unction during said predetermined mode of operation, wherein:
one of said at least one modes of operation is a state retention mode;
said second storage block is configured to perform said second function by operating as a state retention latch in said state retention mode in order to retain a data value whilst said first storage block is powered down;

said predetermined mode of operation is a normal mode of operation where said second function is unused; and said first storage block is configured to perform said first function by operating as a latch of a flip-flop during said normal mode of operation.

7. Storage circuitry as claimed in claim 6, wherein said first storage block is configured to perform said first function by operating as a master latch of a flip-flop during said normal mode of operation.

8. Storage circuitry as claimed in claim 6, wherein said first storage block is configured to perform said first function by operating as one of a master latch and a slave latch of a flip-flop during said normal mode of operation, and the storage circuitry further comprises:

a third storage block configured in said normal mode of operation to perform a third function by operating as the other of a master latch and a slave latch of said flip-flop, so that collectively said first storage block and said third storage block provide the master latch and the slave latch of the flip-flop during said normal mode of operation;

in a standby mode of operation, said third function being unused; and said configuration circuitry being further arranged to be responsive to said standby mode of operation to re-configure the third storage block to store said data in parallel with said first storage block to increase resilience of said first storage block to single event upsets whilst performing said first function during said standby mode of operation.

9. Storage circuitry comprising:

a first storage Hock configured, in at least one mode of operation, to store data to perform a first function;

a second storage block configured, in at least one mode of operation, to store said data to perform a second function distinct from said first function: and configuration circuitry responsive to a predetermined mode of operation where said second function is unused, to re-configure said second storage block to store said data in parallel with said first storage block data to increase resilience of said first storage block to single event upsets (SEUs) whilst performing said first function during said predetermined mode of operation, wherein said configuration circuitry comprises switch circuitry that is responsive to a current mode of operation being said predetermined mode of operation to switch said second storage block into a parallel arrangement with respect to said first storage block, wherein said switch circuitry is responsive to said current mode of operation not being said predetermined mode of operation to switch said second storage block into a serial arrangement with respect to said first storage block.

10. Storage circuitry comprising:

a first storage block configured, in at least one mode of operation, to store data to perform a first function;

a second storage block configured, in at least one mode of operation, to store said data to perform a second function distinct from said first function; and configuration circuitry, responsive to a predetermined mode of operation where said second function is unused, to re-configure said second storage block to store said data in parallel with said first storage block data to increase resilience of said first storage block to single event upsets (SEUs) whilst performing said first function during said predetermined mode of operation, wherein said configuration circuitry comprises switch circuitry that is responsive to a current mode of operation being said predetermined mode of operation to switch said second storage block into a parallel arrangement with respect to said first storage block, wherein:

said configuration circuitry further comprises control circuitry for generating an internal signal from a clock signal provided to said configuration circuitry; and said second storage block includes a switch element which is controlled by the internal signal to selectively configure the second storage block as a latch dependent on a value of said internal signal;

such that when said current mode of operation is said predetermined mode of operation, the switch circuitry switches said second storage block into a parallel arrangement with respect to said first storage block, and the internal signal is set to a value causing the switch element to configure the second storage block as a latch.

11. A method of operating storage circuitry having a first storage block configured in at least one mode of operation to store data to perform a first function, and a second storage block configured in at least one mode of operation to store said data to perform a second function distinct from said first function, the method comprising:

responsive to a predetermined mode of operation where said second function is unused, re-configuring said second storage block to store said data in parallel with said data stored in said first storage block to increase resilience of said first storage block to single event upsets (SEUs) whilst performing said first function during said predetermined mode of operation, wherein:

one of said at least one modes of operation is a normal mode of operation;

said first storage block is configured to perform said first function by operating as a master latch of a flip-flop during said normal mode of operation, and said second storage block is configured to perform said second function by operating as a slave latch of said flip-flop during said normal mode of operation;

said predetermined mode of operation is a standby mode of operation where said first storage block performs said first function to retain a data value, and said second function is unused.

12. Storage circuitry comprising:

a first storage means for storing data to perform a first function in at least one mode of operation;

a second storage means for storing said data to perform a second function in at least one mode of operation, the second function being distinct from said first function; and configuration means, responsive to a predetermined mode of operation where said second function is unused, for re-configuring said second storage means to store said data in parallel with said data stored in said first storage means to increase resilience of said first storage means to single event upsets (SEUs) whilst performing said first function during said predetermined mode of operation, wherein:

one of said at least one modes of operation is a normal mode of operation;

said first storage means is configured to perform said first function by operating as a master latch of a flip-flop during said normal mode of operation, and said second storage means is configured to perform said second function by operating as a slave latch of said flip-flop during said normal mode of operation:

said predetermined mode of operation is a standby mode of operation where said first storage means performs said first function to retain a data value, and said second function is unused.

* * * * *